United States Patent [19]

Tanaka

[11] Patent Number: 4,894,132
[45] Date of Patent: Jan. 16, 1990

[54] SPUTTERING METHOD AND APPARATUS
[75] Inventor: Makoto Tanaka, Fukuoka, Japan
[73] Assignee: Mitsubishi Denki Kabushiki Kaisha, Japan
[21] Appl. No.: 259,780
[22] Filed: Oct. 19, 1988
[30] Foreign Application Priority Data Oct. 21, 1987 [JP] Japan .................... 62-267158

[51] Int. Cl.$^4$ ............................. C23C 14/54
[52] U.S. Cl. ................... 204/192.13; 204/298
[58] Field of Search ............. 204/192.13, 298 MT
[56] References Cited

U.S. PATENT DOCUMENTS 3,654,109 4/1972 Hohl et al. ............. 204/192.13 X
3,734,620 5/1973 Cade ..................... 204/298 X
4,166,784 9/1979 Chapin et al. ............ 204/192.13

FOREIGN PATENT DOCUMENTS 58-154627 9/1983 Japan ..................... 204/192.13
61-76670 5/1986 Japan ..................... 204/298
62-180070 8/1987 Japan ..................... 204/298

Primary Examiner—Aaron Weisstuch
Attorney, Agent, or Firm—Leydig, Voit & Mayer

[57] ABSTRACT

A sputtering method and apparatus are disclosed in which a target metal is sputtered by a glow discharge in sputtering gases to deposit the target metal on a semiconductor wafer. AN absorption spectrum of the sputtering atmosphere is measured during the sputtering of the target metal. The sputtering conditions of the target metal are controlled to provide a predetermined absorption spectrum.

6 Claims, 3 Drawing Sheets

SPUTTERING METHOD AND APPARATUS

BACKGROUND OF THE INVENTION

1. Field of the Invention

The present invention relates to a sputtering method and apparatus for forming a thin metal film on the surface of a semiconductor wafer.

2. Description of the Related Art

In general, a method is employed in which a metal called a target is sputtered and deposited on a semiconductor wafer at the time of forming electrodes or the like in the semiconductor devices. In this method, the target is disposed on a cathode electrode, while a semiconductor wafer is disposed at the position opposing this target. Sputtering energy is applied to the target in an inert gas atmosphere under a pressure of several Pascals for the purpose of sputtering the target so that it is deposited on the semiconductor wafer.

FIG. 1 shows the structure of a conventional sputtering apparatus. A target 2 and a wafer retainer 3 are disposed in an opposed manner in a sputter chamber 1 which is disposed in a housing 1a. The wafer retainer 3 is provided for the purpose of holding semiconductor wafers 12, and is disposed in such a manner that the distance from the target 2 to the wafer retainer 3 can be changed by an adjusting device 5 secured to the housing 1a. A cathode of a DC power source 4 is connected to the target 2, while an anode of the same is connected to the housing 1a. Gas sources 7a to 7d are connected to the sputter chamber 1 via corresponding valves 8a to 8d. Furthermore, the DC power source 4, the adjusting device 5 and the valves 8a to 8d are electrically connected to a controller 6 so that they are respectively controlled by this controller 6. A vacuum pumping device (not shown) is connected to the sputter chamber 1.

Next, the operation of the above-described conventional apparatus will be described while employing Ti as the target 2 and Ar in the gas sources 7a to 7d as the sputtering gas.

First, the semiconductor wafers 12 are set on the wafer retainer 3, and the internal pressure in the sputter chamber 1 is decreased by the unillustrated vacuum pumping device to provide a high vacuum state. The valve 8a is then opened by the controller 6 so that the Ar gas is supplied into the sputter chamber 1 from the gas source 7a to fill the sputter chamber 1 with an Ar gas atmosphere at a pressure of 0.5 to 2.0 Pa.

When a direct current voltage is supplied from the DC power source 4 to the target 2 in this state, a glow discharge occurs between the target 2 and the wafer retainer 3. With the glow discharge, Ar ions are generated to create a plasma. The Ar ions thus generated crash into the target 2 which is connected to the cathode of the DC power source 4, causing Ti atoms to be sputtered from the target 2. As a result of this, a thin film of Ti is deposited on the semiconductor wafers 12 held on the wafer retainer 3.

The characteristics of the Ti film which has been deposited on the semiconductor wafers 12 are determined by the pressure level of the Ar gas in the sputter chamber 1, the voltage level and the current value applied to the target 2, and the distance between the target 2 and the semiconductor wafers 12.

However, since the relationships between each of the factors have not been clarified thoroughly yet, sputtering and measuring the characteristics of the actually deposited thin Ti film are alternately conducted with each of the factors adjusted for the purpose of obtaining a thin Ti film having the required characteristics. Therefore, a great deal of time and labor are needed to obtain a thin metal film having the required characteristics.

SUMMARY OF THE INVENTION

Therefore, an object of the present invention is to provide a sputtering method and apparatus by which a thin metal film having required characteristics can be readily formed.

A sputtering method according to the present invention comprises the steps of: sputtering a target metal by a glow discharge in a discharge portion filled with sputtering gases to deposit the sputtered metal on a semiconductor wafer; measuring an absorption spectrum of an atmosphere in the discharge portion during the sputtering of the target metal; and controlling sputtering conditions of the target metal to provide a predetermined absorption spectrum.

A sputtering apparatus according to the present invention comprises: sputtering means for sputtering a target metal by a glow discharge in a discharge portion filled with sputtering gases to deposit the sputtered metal on a semiconductor wafer; light emitting means for emitting light into an atmosphere in the discharge portion; light receiving means for detecting light which has been emitted from the light emitting means and passed through the discharge portion atmosphere, the light receiving means being operable to generate a signal upon receipt of the light; and measuring means connected to receive a signal from the light receiving means for measuring an absorption spectrum of the atmosphere in the discharge portion based on the signal from the light receiving means.

DESCRIPTION OF THE PREFERRED EMBODIMENTS

An embodiment of the present invention will now be described with reference to the accompanying drawings.

Figure 1:
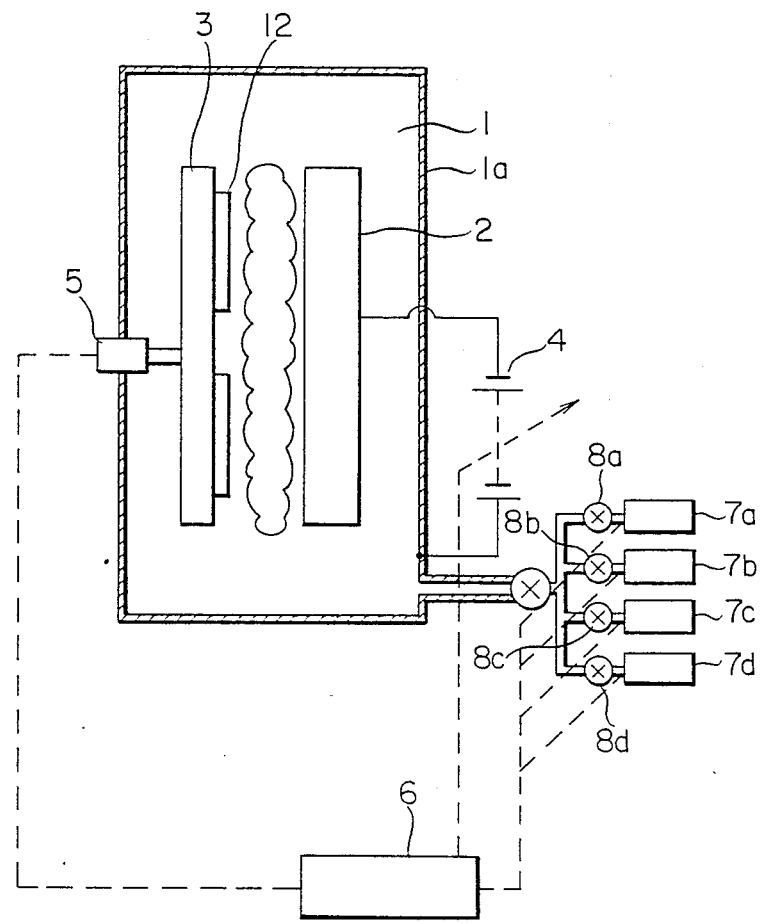
FIG. 1 is a diagrammatic view illustrating the structure of a conventional sputtering apparatus.
Figure 2:
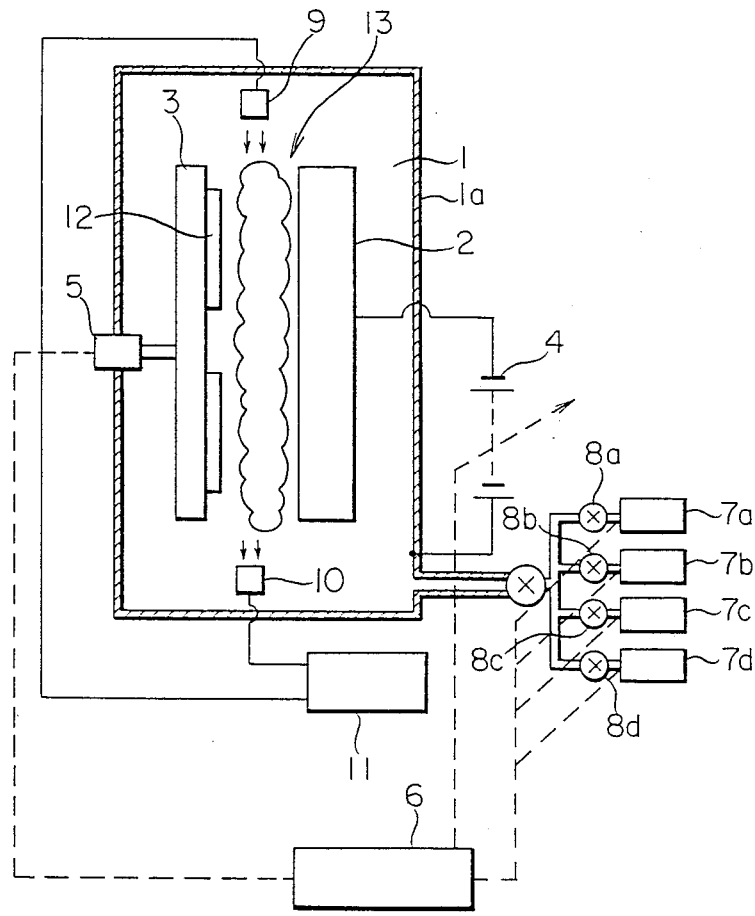
FIG. 2 is a diagrammatic view illustrating the structure of a sputtering apparatus according to an embodiment of the present invention.

Referring to FIG. 2, a target metal 2 and an wafer retainer 3 are disposed in a sputter chamber 1 defined in a housing 1a in an opposed manner with a space 13 therebetween acting as a discharge portion. The wafer retainer 3, serving the purpose of holding semiconductor wafers 12, is disposed for movement toward and away from the target 2 by means of an adjusting device 5 which is secured to the housing 1a. A cathode and an anode of a DC power source 4 are electrically connected to the target 2 and the housing 1a, respectively. The housing 1a is electrically connected to the wafer retainer 3 via the adjusting device 5 so that a voltage can be applied across the target 2 and the wafer retainer 3 by the DC power source 4. A plurality (four in the illustrated embodiment) of gas sources 7a to 7d are connected to the sputter chamber 1 via the corresponding valves 8a to 8d. These gas sources 7a to 7d are respectively filled with sputtering gases having different compositions. The DC power source 4, the adjusting device 5 and the valves 8a to 8d are electrically connected to a controller 6 so that they are respectively controlled by this controller 6.

A light emitting device 9 and a light receiving device 10 are provided at opposite positions facing a discharge portion 13 in the sputter chamber 1. The light emitting device 9 and light receiving device 10 oppose each other and sandwich at least a part of the discharge portion 13. The light emitting device 9 acts to emit a measuring light beam toward the discharge portion 13, while the light receiving device 10 analyzes the spectrum of the measuring light beam which has passed through the discharge portion 13. The light emitting device 9 and light receiving device 10 are electrically connected to a measuring device 11 disposed outside of the housing 1a. This measuring device 11 measures the wavelength and the absorbance of the absorbed rays after determining the absorption spectrum of the gas or plasma atmosphere in the discharge portion 13 through which the measuring beam has passed. The measuring device 11 also serves to perform on-off control of the light emission of the light emitting device 9.

A vacuum pumping device (not shown) is connected to the sputter chamber 1 for producing a vacuum at a desired level therein.

In operation, the semiconductor wafers 12 are first mounted on the wafer retainer 3, and the internal pressure in the sputter chamber 1 is decreased by the unillustrated vacuum pumping device to provide a high vacuum state. Then, a desired one or ones of the valves 8a to 8d connected to the required gas source 7a to 7d is or are opened by the controller 6 so that a sputtering gas or gases such as an Ar gas or the like is or are supplied into the sputter chamber 1 from the gas source 7a to 7d. At this time, the pressure of the sputtering gas or gases in the sputter chamber 1 is made at substantially 0.5 to 2.0 Pa.

When a direct current voltage is, in this state, supplied from the DC power source 4 to the target 2 formed of Ti or the like, a glow discharge occurs between the target 2 and the wafer retainer 3. With the glow discharge, a sputtering gas plasma is generated in the discharge portion 13 and plasma particles such as Ar ions or the like crash into the target 2 which is connected to the cathode of the DC power source 4. As a result, metal atoms such as Ti or the like forming the target 2 are sputtered and deposited on the semiconductor wafers 12 held on the wafer retainer 3.

Simultaneous with this sputtering, the light emitting device 9 is actuated by the measuring device 11 to emit measuring beams toward the light receiving device 10. The measuring beams from the light emitting device 9 pass through a mixture of the plasma and the sputtering gas in the discharge portion 13 during sputtering, and are received by the light receiving device 10 in which they are spectrally analyzed.

Subsequently, the measuring device 11 receives the results of the spectral analysis performed by the light receiving device 10 device 11 measures the wavelength and the absorbance of the absorbed rays at the of the atmosphere in the discharge portion 13 based on the results of the spectral analysis. This measurement is always conducted during the sputtering of the metal atoms.

The absorbance of the absorbed rays having a specific wavelength by the metal atoms to be sputtered can be controlled to be of a predetermined value by the following measures: the DC power source 4 is adjusted by the controller 6 to change the voltage and current applied to the target 2; the distance between the target 2 and the semiconductor wafers 12 is adjusted by the adjusting device 5; and the pressure and the composition ratio of the sputtering gases in the sputter chamber 1 are changed by adjusting the valves 8a to 8d. As a result of these adjustments, a thin metal film having the required characteristics can be stably formed with high efficiency.

In this connection, it is to be noted that the measuring device 11 and the controller 6 may be electrically connected with each other so that the controller 6 can automatically adjust the DC power source 4, the adjusting device 5 or the valves 8a to 8d in response to the wavelength and the absorbance of the absorbed rays obtained by the measuring device 11. In this case, the controller 6 and the measuring device 11 can include a computer.

Since the glow discharge generated in the discharge portion 13 generally produces a light emission, its light spectrum may be observed. In this case, in order to capture the light emitted by the glow discharge, a light receiving device needs to correctly face a light emitting portion in the discharge portion 13. However, the size and position of the light emitting portion in the discharge portion 13 is changing in response to changing of the sputtering gas pressure in the sputter chamber 1, the voltage and current applied to the target 2, and the distance between the target 2 and the semiconductor wafers 12. Therefore, the position of the light receiving device is limited. Furthermore, it is difficult to effectively capture the light emitted by the glow discharge, thus reducing the accuracy in the spectral measurement.

However, according to the present invention, since the absorption spectrum of the atmosphere in the discharge portion 13 is observed, the light receiving device 10 need not necessarily face the light emitting portion in the discharge portion 13, and the light emitting device 9 and the light receiving device 10 may be disposed in such a manner that the light emitted by the light emitting device 9 can reach the light receiving device 10 after passing through at least a part of the atmosphere in the discharge portion 13. That is, in the present invention, the disposition of the light emitting device 9 and the light receiving device 10 with respect to the light emitting portion has great freedom, and the spectral measurement can be accurately conducted.

A light having a relatively wide range of wavelengths may be used as the measuring beam emitted by the light emitting device 9 for the purpose of measuring the absorbance over the entire wavelength range. In this case, as the light receiving device 10, for example, a spectroscope using a diffraction grating can be employed. Alternatively, only the absorbance of a specific wavelength of the metal atom to be sputtered may be measured. In this case, a light receiving element having no spectral characteristics may be employed.

As an alternative to the DC power source 4, a high frequency power source which supplies high frequency power to the target 2 may be employed.

Figure 3:
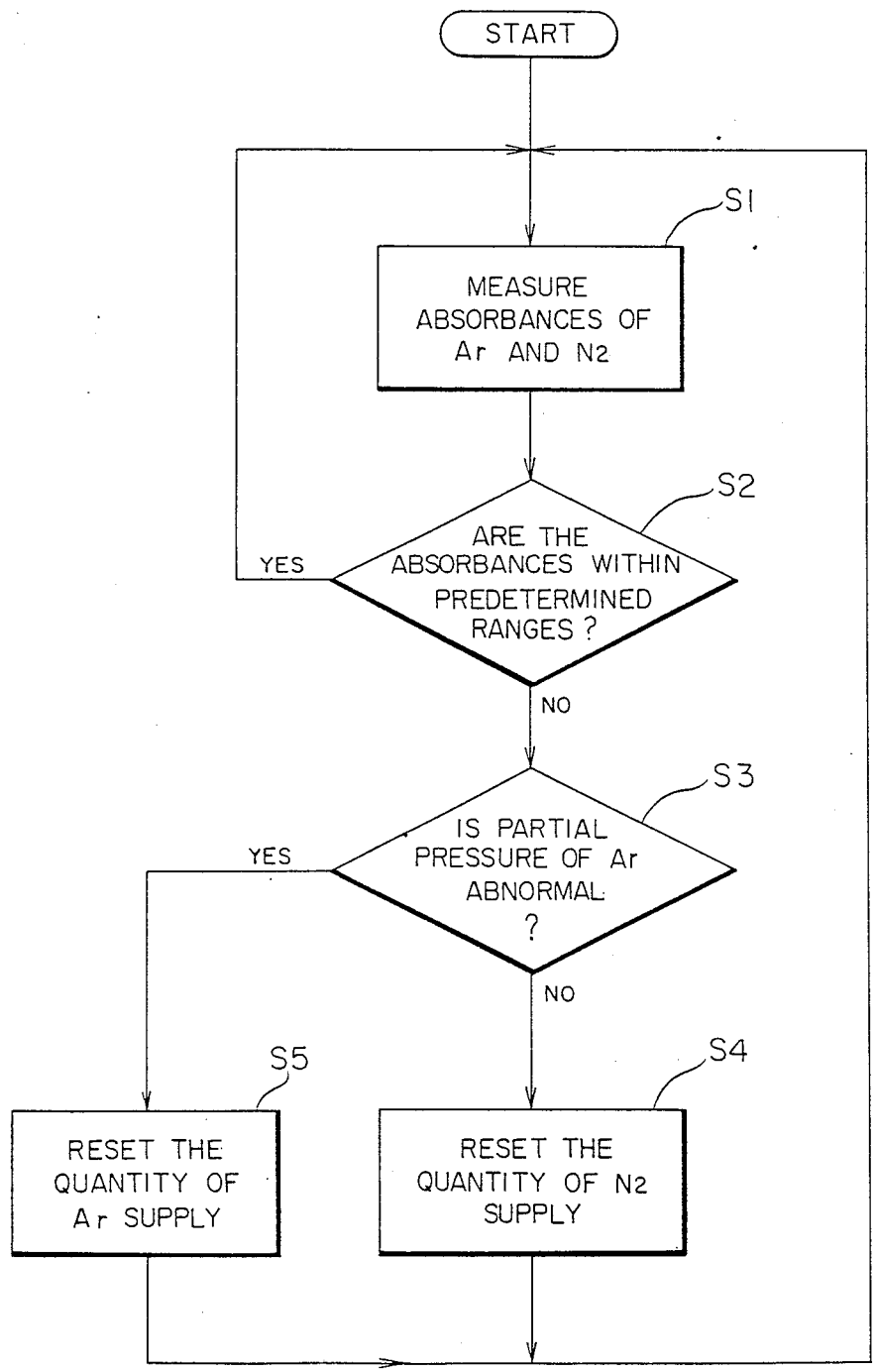
FIG. 3 is a flow chart illustrating a method of controlling the partial pressure of a sputtering gas at the time of sputtering by using the apparatus shown in FIG. 2.

Next, a method of controlling the quantity of the sputtering gas supply using the apparatus shown in FIG. 2 and Ar and $N_2$ as the sputtering gases will be described with reference to a flow chart shown in FIG. 3.

It is assumed that Ar gas is contained in the gas source 7a and $N_2$ gas in the gas source 7b. The semiconductor wafers 12 are mounted on the wafer retainer 3, and the inside of the sputter chamber 1 is drawn by the unillustrated vacuum pumping device to a high vacuum state. Then, the valves 8a and 8b are opened by the controller 6 so that Ar and $N_2$ sputtering gases are respectively supplied from the corresponding gas sources 7a and 7b to the inside of the sputter chamber 1.

In this state, the light emitting device 9 and the light receiving device 10 are actuated by the measuring device 11 to conduct the measurement of the absorption spectrum of the atmosphere in the discharge portion 13. First in Step S1, the absorbances of the Ar and $N_2$ are measured by using this absorption spectrum, and in Step S2, it is determined whether these absorbances are within a predetermined range or not.

If each of the absorbances is determined to be within the predetermined range in Step S2, the control process returns to Step S1 wherein the absorbances are again observed. If each of the absorbances is out of the predetermined range, the partial pressure of the Ar gas is calculated by using the measured absorbances. In Step S3, it is determined whether the thus-calculated partial pressure is abnormal or not. If the partial pressure of the Ar gas is not abnormal, the valve 8b is adjusted to reset the quantity of the $N_2$ gas supply in Step S4, whereas if the partial pressure of the Ar gas is abnormal, the valve 8a is adjusted to reset the quantity of the Ar gas supply in Step S5. Thereafter, the control process returns to Step S1 where the absorbance of each of the gases is again observed.

By performing sputtering with the quantity of the sputtering gas supply controlled as described above, a thin metal film having stable characteristics is formed.

Although two types of sputtering gases are used in this embodiment, the quantity of the gas supply can be controlled in the same manner even if three or more sputtering gases are used. Furthermore, the control of the voltage and current to be applied to the target 2 or the distance between the target 2 and the semiconductor wafers 12 can be controlled similar to the manner as shown by flow chart in FIG. 3.

What is claimed is:

1. A sputtering method comprising:
   sputtering a target metal in a glow discharge in sputtering gases to deposit the target metal on a wafer;
   measuring an absorption spectrum of the sputtering gases during sputtering of the target metal; and
   controlling the sputtering conditions in response to said measurements, including varying the separation between the target metal and the wafer, to provide a predetermined absorption spectrum.

2. A sputtering method according to claim 1 including controlling the sputtering conditions by varying at least one of the composition and pressure of the sputtering gases and the voltage applied to generate the glow discharge.

3. A sputtering method according to claim 1 wherein a plasma is formed in the sputtering gases.

4. A sputtering apparatus comprising:
   sputtering means for sputtering a target metal in a glow discharge in sputtering gases to deposit the target metal on a wafer;
   light emitting means for emitting light into the sputtering gases;
   light receiving means for detecting the light which has been emitted from said light emitting means and passed through the sputtering gases, said light receiving means generating a signal upon receipt of the light;
   measuring means connected to receive the signal from said light receiving means for measuring an absorption spectrum of the sputtering gases; and
   control means for controlling the sputtering conditions, including varying the separation between the target metal and the wafer, to provide a predetermined absorption spectrum.

5. A sputtering apparatus according to claim 4 wherein said sputtering means comprises:
   a sputter chamber in which the target metal is disposed;
   wafer retaining means for holding the wafer in spaced relation opposite the target metal in said sputter chamber;
   said control means including adjusting means for varying the separation between said wafer retaining means and the target metal;
   gas supplying the means for supplying the sputtering gases to said sputter chamber; and
   a power source for applying a voltage across the target metal and said wafer retaining means.

6. A sputtering apparatus according to claim 5 further comprising control means for controlling at least one of the quantity of the sputtering gases supplied by said gas supplying means, and the voltage supplied by said power source, so that the absorption spectrum measured by said measuring means is a predetermined spectrum.

* * * * *